(12) United States Patent
Singh et al.

(10) Patent No.: US 10,083,904 B2
(45) Date of Patent: Sep. 25, 2018

(54) METHOLODOGY FOR PROFILE CONTROL AND CAPACITANCE REDUCTION

(71) Applicant: GLOBALFOUNDRIES Inc., Grand Cayman (KY)

(72) Inventors: Sunil Kumar Singh, Mechanicville, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 30 days.

(21) Appl. No.: 14/993,238

(22) Filed: Jan. 12, 2016

(65) Prior Publication Data

US 2017/0200674 A1    Jul. 13, 2017

(51) Int. Cl.
| | |
|---|---|
| *H01L 23/522* | (2006.01) |
| *H01L 21/768* | (2006.01) |
| *H01L 21/02* | (2006.01) |
| *H01L 21/321* | (2006.01) |
| *H01L 23/528* | (2006.01) |
| *H01L 23/532* | (2006.01) |

(52) U.S. Cl.
CPC .... *H01L 23/5226* (2013.01); *H01L 21/02167* (2013.01); *H01L 21/02271* (2013.01); *H01L 21/3212* (2013.01); *H01L 21/7684* (2013.01); *H01L 21/76802* (2013.01); *H01L 21/76834* (2013.01); *H01L 21/76877* (2013.01); *H01L 23/528* (2013.01); *H01L 23/5329* (2013.01)

(58) Field of Classification Search
CPC ........... H01L 21/02129; H01L 21/3147; H01L 21/76804; H01L 21/76807; H01L 21/76826; H01L 21/02167; H01L 23/5226
See application file for complete search history.

(56) References Cited

U.S. PATENT DOCUMENTS

| | | | | |
|---|---|---|---|---|
| 7,015,581 | B2 * | 3/2006 | Casey | H01L 21/02129 257/750 |
| 2003/0111263 | A1 * | 6/2003 | Fornof | H01L 21/02118 174/262 |
| 2004/0097099 | A1 * | 5/2004 | Li | H01L 21/76826 438/766 |
| 2005/0079725 | A1 * | 4/2005 | Zhu | H01L 21/76807 438/710 |
| 2005/0200025 | A1 * | 9/2005 | Casey | H01L 21/02129 257/762 |
| 2006/0076682 | A1 * | 4/2006 | Liu | H01L 21/76804 257/758 |

(Continued)

OTHER PUBLICATIONS

Singh et al., "Hot-wire chemical-vapor-deposited nanometer range a-SiC:H diffusion barrier films for ultralarge-scale-integrated application", Journal of Vacuum Science and Technology B, Feb. 8, 2006, vol. 24, No. 2, pp. 543-546.

*Primary Examiner* — Marc Armand
(74) *Attorney, Agent, or Firm* — Ditthavong & Steiner, P.C.

(57) ABSTRACT

Methodologies and a device for reducing capacitance and improving profile control are provided. Embodiments include forming metal vias in a first dielectric layer; forming a graded interlayer dielectric over the metal vias; forming a metal layer in the graded ILD over one of the metal vias; and forming a hydrogenated amorphous silicon carbon film over the metal layer.

9 Claims, 4 Drawing Sheets

(56) References Cited

U.S. PATENT DOCUMENTS

2006/0208257 A1\* 9/2006 Branz ................ H01L 21/3147
 257/49
2007/0120262 A1\* 5/2007 Lee .................. H01L 21/76807
 257/760

\* cited by examiner

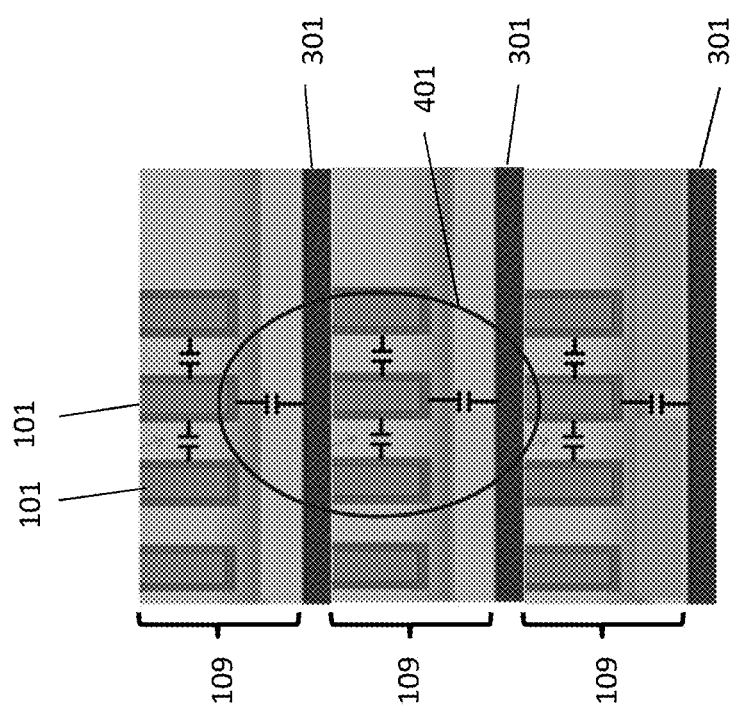

US 10,083,904 B2

METHOLODOGY FOR PROFILE CONTROL AND CAPACITANCE REDUCTION

TECHNICAL FIELD

The present disclosure relates to the manufacture of semiconductor devices having interconnects. In particular, the present disclosure relates to profile control and capacitance reduction for semiconductor devices in the 14 nanometer (nm) technology node and beyond.

BACKGROUND

In a semiconductor integrated circuit (IC) fabrication process, the back end of line (BEOL) processing results in interconnects including alternating metal (e.g., copper) and interlayer dielectric (ILD) layers, with vias through the ILD layers connecting the metal layers. With current processes, electrical shorts in interconnects (VxMx) and time dependent dielectric breakdown (TDDB) in conductive vias (Vx) can occur due to charge chamfer angle. Specifically, an interconnect becomes misaligned with the underlying via, causing an overlay, creating a charge chamfer angle. TDDB is the most significant scaling limiter for BEOL and forces manufacturers to use self-aligned double patterning (SADP) lithography. Moreover, another drawback with current processing is ILD damage caused by chemical mechanical polishing (CMP) after metallization and subsequent etch stop layer formation using plasma enhanced chemical vapor deposition (PECVD) to deposit a nitrogen doped carbide (NDC) or silicon carbon nitride (SiCNH or NBlock) diffusion layer. Electron energy loss spectroscopy (EELS) line scan demonstrates that almost 2.5 nanometers (nm) of damage can occur in the ILD after integration which undesirably increases lateral capacitance.

A need therefore exists for improved methodology and an apparatus that reduces the risk of electrical short and ILD damage during semiconductor manufacturing.

SUMMARY

An aspect of the present disclosure is a method and device for reducing capacitance and improving profile control in semiconductor manufacturing. Another aspect of the present disclosure is to reduce via chamfer and TDDB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming metal vias in a first dielectric layer; forming a graded interlayer (ILD over the metal vias; forming a metal layer in the graded ILD over one of the metal vias; and forming a hydrogenated amorphous silicon carbon ($\alpha$-SiC:H) film over the metal layer.

Aspects of the present disclosure include forming the $\alpha$-SiC:H film by hot wire chemical vapor deposition (HWCVD). Another aspect includes forming the graded ILD with an ultra low-k dielectric (ULK) material. Further aspects include forming the graded ILD with an upper portion more porous than a lower portion. Additional aspects include forming the graded ILD with a third portion lower than and more porous than the lower portion of the graded ILD. Yet further aspects include forming the upper portion of the graded ILD to a thickness of 50 to 70 nm. Other aspects include forming the lower portion of the graded ILD to a thickness of 5 to 15 nm; and forming the third portion of the graded ILD to a thickness of 25 to 35 nm. Still further aspects include planarizing the metal layer by CMP prior to forming the $\alpha$-SiC:H film. Aspects include forming a second metal layer over the $\alpha$-SiC:H film. Additional aspects include forming an etch stop layer between the graded ILD and metal vias. Further aspects include forming the $\alpha$-SiC:H film to a thickness of 10 to 20 nm.

Another aspect of the present disclosure is a device including: metal vias formed in a first dielectric layer; a graded ILD formed over the metal vias, the graded ILD having upper portion more porous than a lower portion; a metal layer formed in the graded ILD over one of the metal vias; and a $\alpha$-SiC:H film formed over the metal layer.

Aspects include the $\alpha$-SiC:H film being formed by HWCVD. Other aspects include the graded ILD comprises an ULK material. Additional aspect include an etch stop layer being formed between the graded ILD and the metal vias. Still further aspects include a second metal layer being formed over the $\alpha$-SiC:H film. Another aspect includes the $\alpha$-SiC:H film having a thickness of 10 to 20 nm. Additional aspects include the graded ILD including a third portion lower than and more porous than the lower portion of the graded ILD.

Yet another aspect of the present disclosure is a method including forming metal vias in a first dielectric layer; forming a graded ILD over the metal vias, the graded ILD having upper and lower portions that are more porous than a middle portion; forming a metal layer in the graded ILD over one of the metal vias; planarizing the metal layer by CMP; and forming a $\alpha$-SiC:H film over the metal layer by HWCVD. Aspects include forming the $\alpha$-SiC:H film to a thickness of 10 to 20 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

EEGs 1 through 3 schematically illustrate a process flow to produce a semiconductor device, in accordance with an exemplary embodiment; and FIG. 4 schematically illustrates a semiconductor device, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of electrical shorts and ILD damage attendant upon forming metal interconnects during semiconductor manufacturing. Methodology in accordance with embodiments of the present disclosure includes forming metal vias in a first dielectric layer; forming a graded ILD over the metal vias; forming a metal layer in the graded ILD over one of the metal vias; and forming a hydrogenated amorphous silicon carbon ($\alpha$-SiC:H) film over the metal layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
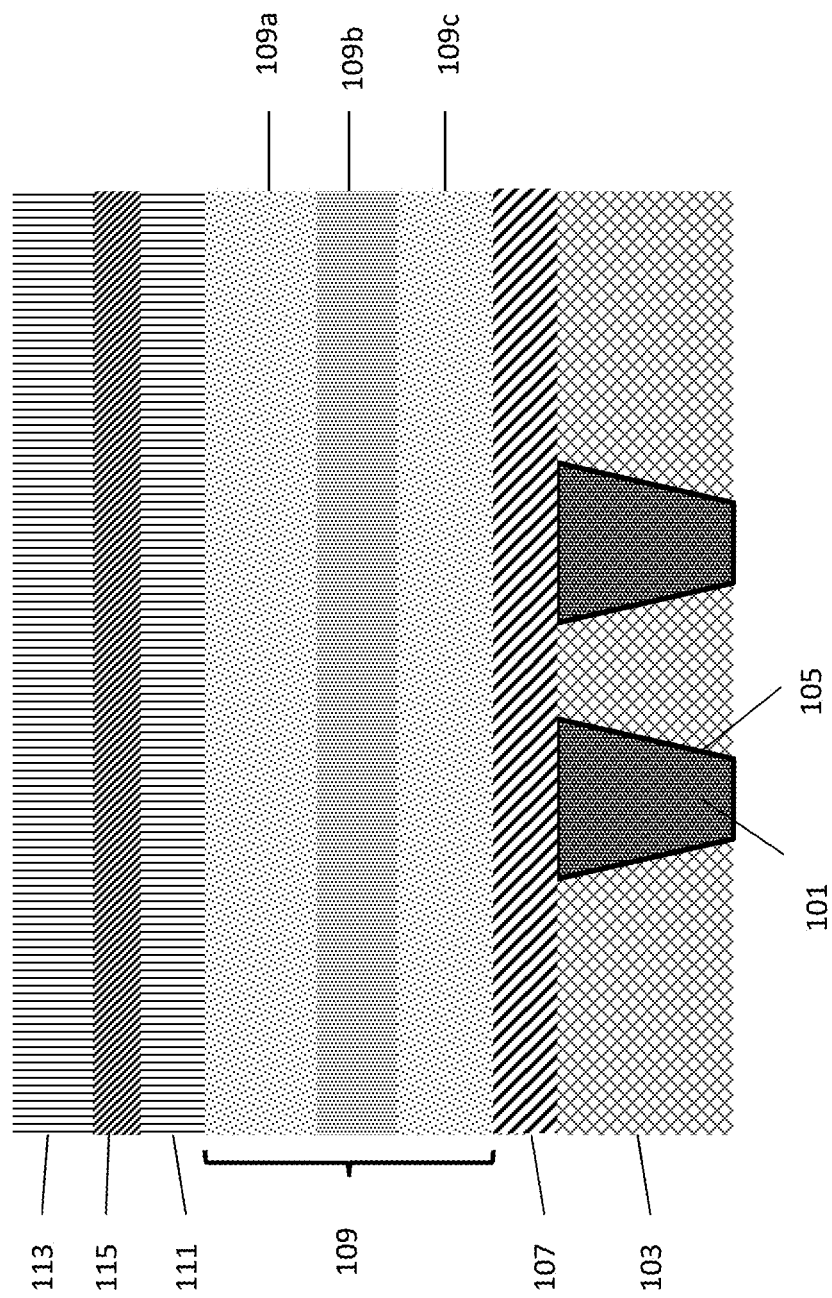

Adverting to FIG. 1, vias 101 are formed in a dielectric layer 103. Vias 101 are filled with a metal (e.g., copper (Cu)) and include a barrier liner 105 formed around side and bottom surfaces of vias 101. Etch stop layer 107 is deposited over the vias 101 and dielectric layer 103. Etch stop layer 107 is used to drastically slow the etch rate, providing a stopping point of high accuracy. Etch stop layer 107 can be formed to a thickness of 10 to 20 nm and may be formed of materials such as NDC, NBLOK, silicon carbide (SiC), or boron-doped SiC.

A graded ULK dielectric layer 109 (rather than the uniform ULK dielectric layer of current processes) is formed over the etch stop layer 107. The graded ULK dielectric layer 109 includes three regions 109a, 109b, and 109c. The middle region 109b is the densest region. Upper region 109a is more porous (i.e., less dense) than the middle region 109b. Lower region 109c is also more porous (i.e., less dense) than middle region 109b. Upper region 109a may be formed to a thickness of 50 to 70 nm. Middle region 109b may be formed to thickness of 5 to 15 nm. Lower region 109c may be formed to a thickness of 25 to 35 nm.

The porosity of the regions can be adjusted by adjusting an amount of porogen and a UV curing process. Exemplary materials used for the graded ULK dielectric layer 109 include carbon doped oxide dielectrics comprised of Si, C, O, and H (SiCOH) with a dielectric constant of 2.4 to 2.6. The stack of FIG. 1 further includes a first metal layer 111 and second metal layer 113 separated by hard mask 115, which may be formed of titanium nitride (TiN). FIG. 1 illustrates a stack formation prior to additional lithography processes (not shown for illustrative convenience) performed on the stack.

Figure 2:
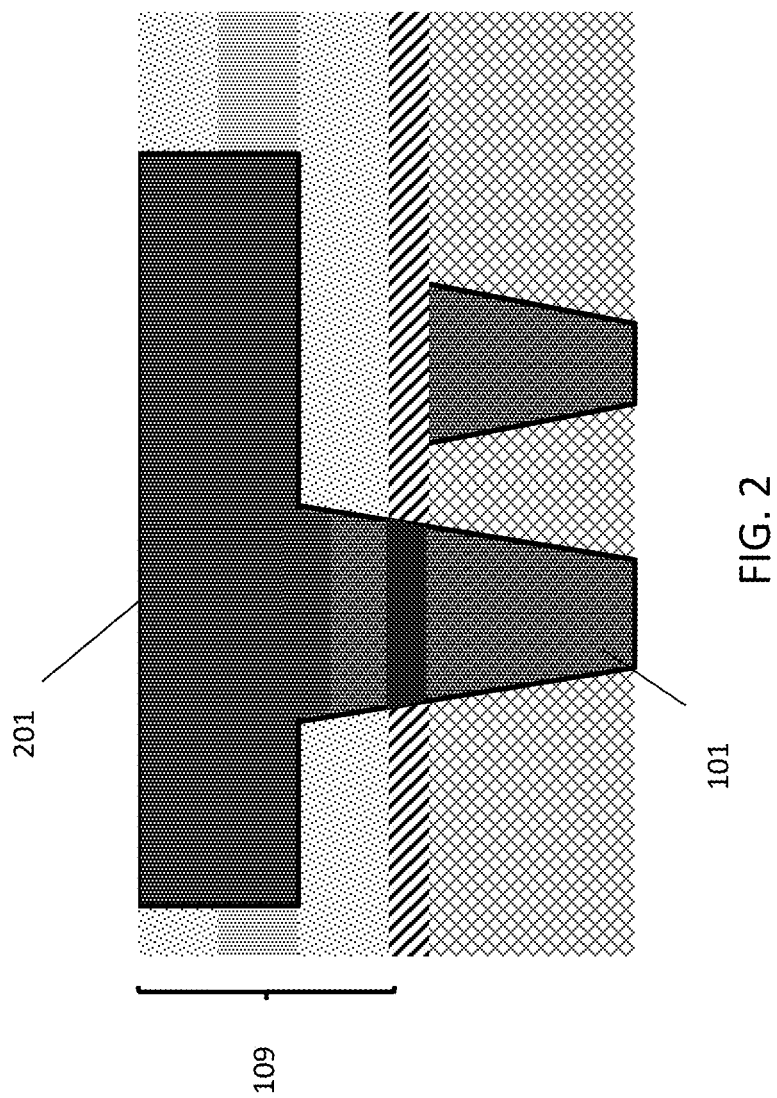

As shown in FIG. 2, a metal layer 201 is formed in the graded ULK dielectric layer 109 above vias 101. The metal layer 201 is connected to one of vias 101. Excess metal produced from the deposition of the metal layer 201 is removed with CMP to planarize an upper surface of the metal layer 201 and the graded ULK dielectric layer 109. Examples of metals used for the metal layer 201 include copper and barrier metal (tantalum nitride/tantalum (TaN/Ta) or TaN/Ta/cobalt (Co), ruthenium (Ru) or any other metal barrier.

In FIG. 2, the metal layer 201 is aligned over one of the vias 101 and is not shifted or deviated (i.e., no charge chamfer angle is present) in a lateral direction towards an adjacent via 101. Thus, the lateral capacitance between adjacent vias can be controlled. The graded ULK dielectric layer 109 helps maintain the aligned orientation of the metal layer 201 during processing and prevents any overlay error of the metal layer 201 on the via 101. No electrical short occurs because no overlay error exists, and the metal layer 201 is properly aligned over the via 101, as shown on FIG. 2.

Figure 3:
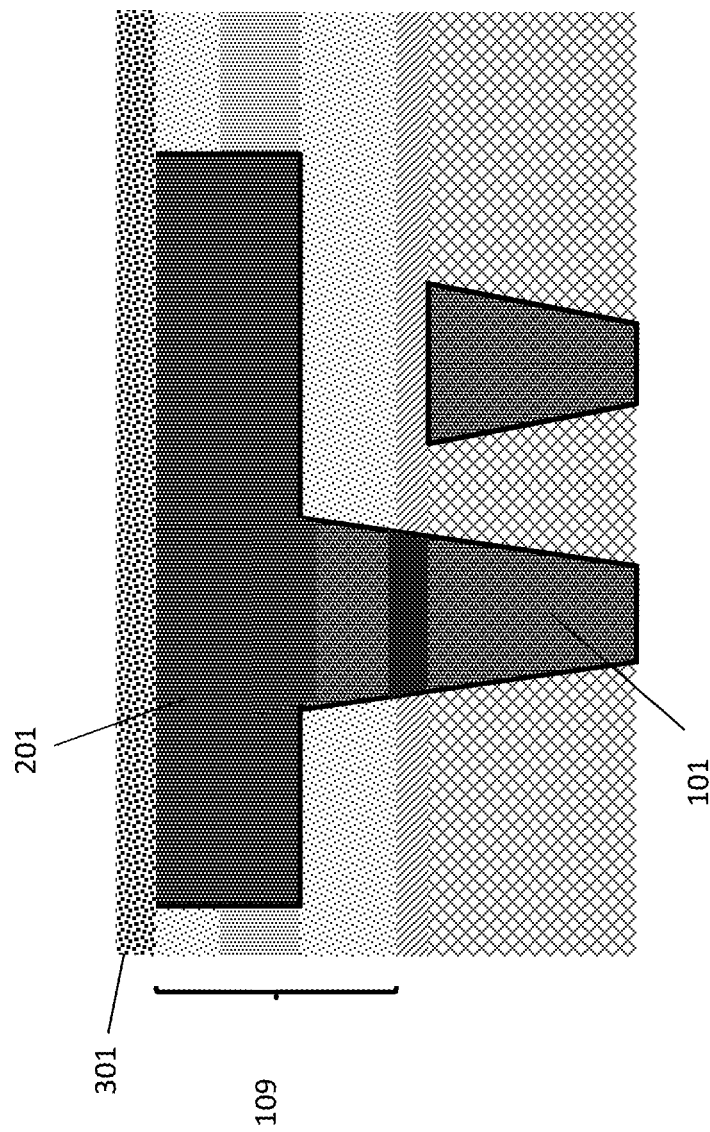

Adverting to FIG. 3, the etching process can be controlled, and the proper chamfer angle can be maintained with the presence of an $\alpha$-SiC:H film 301 serving as a barrier layer and formed over the metal layer 201 by HWCVD. The $\alpha$-SiC:H film 301 may be formed to a thickness of 10 to 20 nm.

Conventional methods, such as PECVD, deposit a barrier layer such as NDC or NBlock which results in plasma induced damage (PID) of an underlying dielectric layer such as the ILD. With HWCVD, PID can be eliminated, and resistance capacitance (RC) can be reduced up to 6.5%. Further, TDDB performance can be improved, since CMP related damage can be recovered with the $\alpha$-SiC:H film 301 formed by HWCVD. HWCVD does not involve any ion bombardment or ultraviolet (UV) radiation and, therefore, eliminates the possibility of related atomic rearrangement and defects formed in the graded ULK dielectric layer 109. HWCVD uses a hot or high temperature filament (tungsten or tantalum) to chemically decompose a source gas to cause a surface to be coated with a thin film containing silicon present in the silane gas source. The temperature of the filament can rage from 1500° to 2100° C.

As shown in FIG. 4, a resulting semiconductor device having multiple metal layers is produced in accordance with the exemplary embodiment. Graded ULK dielectric layers 109 are formed for each the metal layers depicted in this figure. The $\alpha$-SiC:H film 301 is formed between each pair of the metal layers. Inter capacitance 401 can be optimized with the present methodology which prevents damage to the graded ULK dielectric layers 109 and prevents electrical shorts between adjacent vias 101.

The embodiments of the present disclosure can achieve several technical effects, including improved metal wiring resistance (RS) uniformity, decreased electrical shorts in interconnects, and reduced TDDB in a semiconductor device. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodi-

What is claimed is:

1. A method comprising:
   forming metal vias in a first dielectric layer;
   forming a graded interlayer dielectric (ILD) over the metal vias, the graded ILD comprising three layers and formed by:
      forming a middle ILD layer over a lower ILD layer, and forming an upper ILD layer over the middle ILD layer, wherein the middle ILD layer has a porosity less than the upper and lower ILD layers, and wherein the lower, middle and upper ILD layers comprise an ultra low-k dielectric (ULK) material selected from a carbon doped dielectric;
   forming a metal layer in the graded ILD over one of the metal vias; and
   forming a hydrogenated amorphous silicon carbon (α-SiC:H) film over the metal layer.

2. The method according to claim 1, comprising:
   forming the α-SiC:H film by hot wire chemical vapor deposition (HWCVD).

3. The method according to claim 1, comprising:
   forming the upper ILD layer to a thickness of 50 to 70 nm.

4. The method according to claim 1, comprising:
   forming the middle ILD layer to a thickness of 5 to 15 nm; and
   forming the lower ILD layer to a thickness of 25 to 35 nm.

5. The method according to claim 1, further comprising:
   prior to forming the α-SiC:H film, planarizing the metal layer by chemical mechanical polishing (CMP).

6. The method according to claim 1, further comprising:
   forming an etch stop layer between the graded ILD and metal vias.

7. The method according to claim 1, comprising:
   forming the α-SiC:H film to a thickness of 10 to 20 nanometers (nm).

8. A method comprising:
   forming metal vias in a first dielectric layer;
   forming a graded interlayer dielectric (ILD) over the metal vias, the graded ILD comprising three layers and formed by:
      forming a middle ILD layer over a lower ILD layer, and forming an upper ILD layer over the middle ILD layer, wherein the middle ILD layer has a porosity less than the upper and lower ILD layers, and wherein the lower, middle and upper ILD layers comprise an ultra low-k dielectric (ULK) material selected from a carbon doped dielectric;
   forming a metal layer in the graded ILD over one of the metal vias;
   planarizing the metal layer by chemical mechanical polishing (CMP); and
   forming a hydrogenated amorphous silicon carbon (α-SiC:H) film over the metal layer by hot wire chemical vapor deposition (HWCVD).

9. The method according to claim 8, comprising:
   forming the α-SiC:H film to a thickness of 10 to 20 nanometers (nm).

* * * * *